United States Patent [19]

Boeckmann et al.

[11] Patent Number: 4,844,258
[45] Date of Patent: Jul. 4, 1989

[54] WIDE CARRIER TAPE

[75] Inventors: Hugo Boeckmann, Arlington Hts.; Donald Van Erden, Wildwood, both of Ill.

[73] Assignee: Illinois Tool Works Inc., Chicago, Ill.

[21] Appl. No.: 194,876

[22] Filed: May 17, 1988

Related U.S. Application Data

[63] Continuation-in-part of Ser. No. 046,259, May 4, 1987.

[51] Int. Cl.⁴ .............................................. B65D 73/02
[52] U.S. Cl. ..................................... 206/328; 220/281
[58] Field of Search ............... 206/328, 330, 332, 334; 220/281

[56] References Cited

U.S. PATENT DOCUMENTS

| | | | |
|---|---|---|---|
| 1,676,868 | 7/1928 | Petersen | 220/281 |
| 3,484,016 | 12/1969 | Turner | 220/281 |
| 4,180,178 | 12/1979 | Turner | 220/281 |
| 4,187,953 | 2/1980 | Turner | 220/281 |
| 4,500,066 | 2/1985 | La Fortune et al. | 220/281 |
| 4,721,207 | 1/1988 | Kikuchi | 206/328 |
| 4,733,778 | 3/1988 | Boeckmann et al. | 206/328 |

Primary Examiner—Joseph Man-Fu Moy
Attorney, Agent, or Firm—John P. O'Brien; Thomas W. Buckman

[57] ABSTRACT

An improved carrier tape is disclosed comprising a cover strip and a base strip formed of a plastic material and designed to mechanically interlock with each other. The cover strip includes a top surface from which opposed sidewalls extend downwardly. The cover strip is further provided with a pair of longitudinally extending humps which project upwardly from the top face. The humps are generally semi-circular in cross-section and are positioned adjacent the edges of the cover strip, spaced inwardly of the sidewalls. The humps define living hinges for the adjacent surfaces of the cover strip top face and the sidewalls so that when the humps are depressed the sidewalls move laterally outwardly.

5 Claims, 1 Drawing Sheet

WIDE CARRIER TAPE

CROSS REFERENCE TO RELATED APPLICATIONS

The present application is a continuation-in-part of application Ser. No. 046,259, filed May 4, 1987, entitled Carrier Tape and Cover Applying and Removal Devices for Same.

BACKGROUND OF THE INVENTION

Carrier tapes are of ever increasing important in assembly operations in numerous industries including, in particular, the electronic and pharmaceutical industries. The tapes are used, for example, to transport miniature and subminiature electronic components from a component manufacturer to a customer's assembly station where automatic equipment functions to remove the component from the carrier tape and mount the component to a circuit board of the like. The carrier tape (or transfer tape, as it is sometimes referred to) may also function to bring different components to an assembly station in proper order for sequential assembly.

Such carrier tapes are often in the form of a base strip of plastic or paper which is usually covered by a cover strip. The base strip is formed with a plurality of cavities or pockets for the components and the cover strip is secured to the base strip to thereby prevent the components from prematurely falling out of the cavities. In the past the base strip and cover strip were mostly commonly held in place by an adhesive, heat bond or spaced snap-type fasteners. Typical examples of prior art carrier tapes are disclosed in U.S. Pat. Nos. 3,465,874; 3,650,430; 3,700,019; 3,894,896; 3,910,410; and 4,298,120. The previously mentioned application Ser. No. 046,259 discloses a continuous mechanical interlock between the base strip and cover strip which obviates many of the problems associated with the use of the various prior art methods of securing the base strip and cover strip.

To function properly, a carrier tape must securely convey its cargo as required and then, at the proper location, be capable of being quickly and positively opened so that the component may be easily removed for assembly purposes. The tape should afford a degree of protection for the sensitive components to be conveyed therein with respect to contamination, electrostatic discharge, temperature change and mechanical shock. In addition, the seal or bond between the tape components must be releasable to a known and consistent value of the unloading point to insure that only the required length of base tape will be exposed. Prior art tapes utilizing adhesive or heat bonding techniques present a risk of residue contamination. Further, heat bonding requires the use of relatively high temperatures which may be harmful to the components to be carried. In addition, the use of staticdissipative or conductive additives to prevent or dissipate the build-up of electrostatic charge tends to interfere with the bonding characteristics of adhesives. The previously mentioned application Ser. No. 046,259 discloses an improved carrier tape construction in which the cover strip and base strip are uniformly and consistently secured to one another yet which can readily and positively be separated from one another.

To this end, the disclosed carrier tape comprises an elongated base strip and an elongated cover strip both formed of a plastic film material. The base strip is provided with longitudinally spaced cavities for components to be transported therein as well as a series of spaced, longitudinally extending sprocket drive holes for advancing the tape. The cover tape has sidewalls extending downwardly and terminating in inwardly directed barbs or profiles. The spacing between the sidewalls is substantially equal to the width of the base strip. A raised, longitudinally extending hump is provided in the top face of the cover strip aligned with the sprocket holes when the tape is assembled. The hump defines a living hinge for the adjacent surfaces of the cover strip top face. Accordingly, when the hump is depressed the sidewalls of the cover strip move outwardly so as to clear the edges of the base strip and permit removal of the cover strip. Conversely, when the hump is released, the sidewalls return to their relaxed position securely interlocking with the base strip edges. While this construction avoids many of the problems associated with carrier tapes previously available, it has been found that the construction may only be used with relatively narrow carrier tapes (i.e. less than 24 mm). When wider tapes (e.g. 24 mm, 32 mm, 44 mm or 56 mm) are employed; the single hump tends to only release the adjacent sidewall and to have little or no effect on the opposite sidewalls. This can result in the cover strip catching or binding during removal from the base strip or improperly seating on the base strip. Obviously, there are unacceptable situations.

Another problem encountered with such relatively wide carrier tapes is that two sets sprocket drives are required which in turn requires two sets of sprocket holes extending along opposite sides of the tape. This, in turn requires that provision be made on the cover strip to accommodate both sprockets.

In view of the above, it is the principal object of the present invention to provide an improved carrier tape construction for a relatively wide carrier tape which avoids the use of adhesive and chemical bonding and in which the cover strip and base strip may uniformly and consistently be secured to one another and separated from each other.

Another object is to provide such a carrier tape which may readily be usesd on existing equipment with little or no modification.

Yet another object is to provide such a carrier tape which may readily be used on existing equipment with to facilitate the inspection and replacement of the components carried therein.

SUMMARY OF THE INVENTION

The above and other beneficial objects and advantages are attained in accordance with the present invention by providing an improved carrier tape comprising a cover strip and a base strip formed of a plastic material and designed to mechanically interlock with each other. To this end, the cover strip includes a top surface from which opposed sidewalls extend downwardly. The spacing between at least portions of the sidewalls is substantially equal to the width of the base strip so as to engage the sidewalls of the base strip in a mechanical interlock. At least one strip, usually the base strip, is provided with a longitudinally extending row of cavities for components or the like.

The cover strip is further provided with a pair of longitudinally extending humps which project upwardly from the top face. The humps are generally semi-circular in cross-section and are positioned adjacent the edges of the cover strip, spaced inwardly of the sidewalls. The humps define living hinges for the adjacent surfaces of the cover strip top face. Accordingly, when the hinges are depressed the adjacent sidewalls of the cover strip move laterally outwardly so as to clear the edges of the base strip to thereby facilitate removal and seating of the cover strip on the base strip. Conversely, when the humps are released the sidewalls return to their normal, relaxed position securely interlocking with the base strip edges.

BRIEF DESCRIPTION OF THE DRAWINGS

In the accompanying drawings.

DETAILED DESCRIPTION OF THE PREFERRED EMBODIMENT IMPROVED CARRIER TAPE

Figure 1:
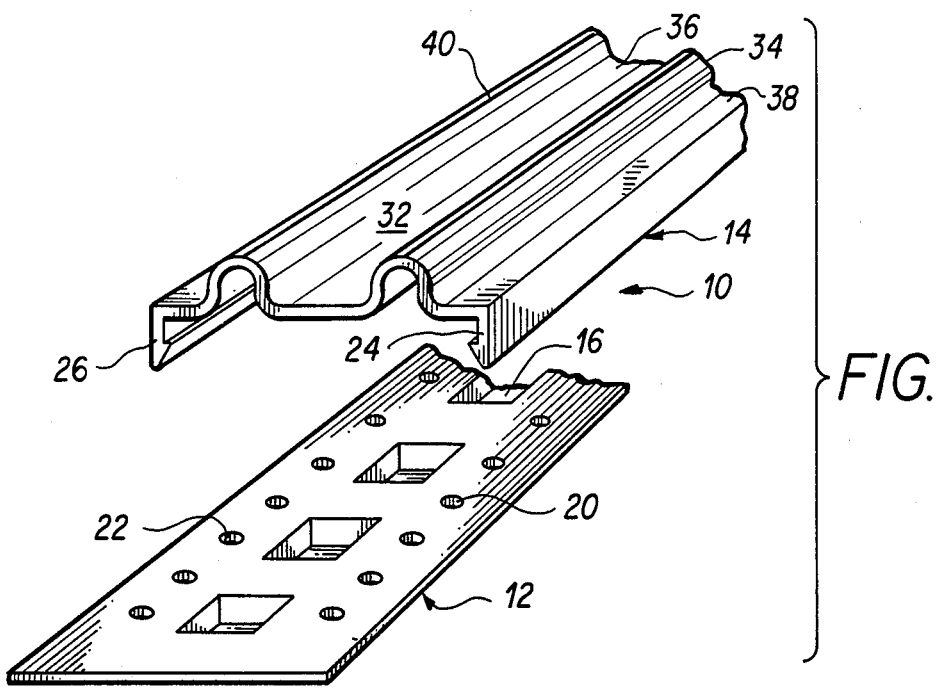
FIG. 1 is a fragmentary, exploded, perspective view of a carrier tape in accordance with the present invention.
Figure 2:
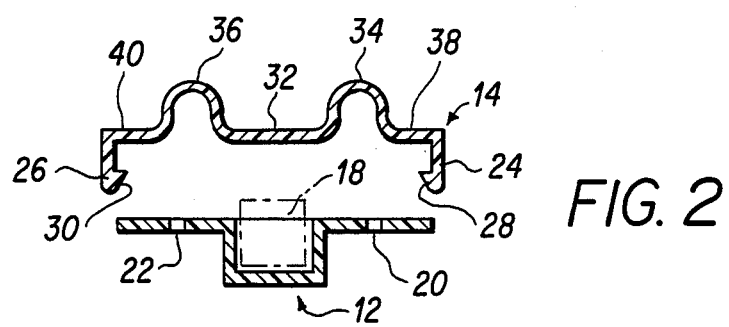
FIG. 2 is an exploded, side elevational sectional view of the carrier tape of FIG. 1.

Reference is now made to the drawings and to FIG. 1 in particular wherein a carrier tape 10 is depicted as comprising an elongated base strip 12 and a generally coextensive cover strip 14. The carrier tape 10 is preferably formed of a suitable plastic film material such as carbon loaded polyvinyl chloride, polypropylene or a glycol based polyester such as polyethylene terephthalate (PETG) which may readily be extruded and vacuum or pressure formed to the desired shape. The tape should be sufficiently flexible to permit it to be spooled.

The base 12 is formed with a plurality of cavities 16 which define individual pockets for the components 18 to be conveyed therein. In this regard, the cavities may be contoured, as required, to maintain the components in a particular orientation, should such orientation be necessary. Two longitudinally extending series of aligned sprockets holes 20 and 22 are provided extending through the base strip 12, on opposite sides of the cavities 16 and adjacent the edges of the base strip.

Figure 4:
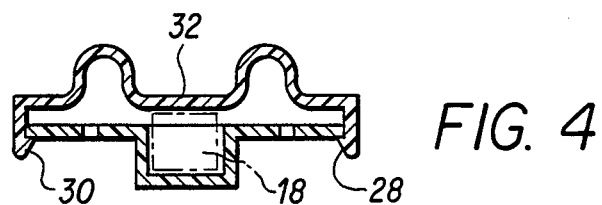

The cover strip 14 is provided, at each side, with a downwardly directed sidewall 24,26 each of which terminates in an inwardly directed profile barb 28,30. The sidewalls are spaced apart from each other a distance substantially equal to the width of the base strip. The height of the sidewalls 24,26 is such that when the cover strip 14 is snapped over the base strip 12 the major face 32 of the cover strip will engage a component 18 within cavity 16 while the profiles 24 and 26 engage the edges of the undersurface of the base strip, as shown in FIG. 4. By this arrangement the component 18 is securely retained in position.

Figure 3:
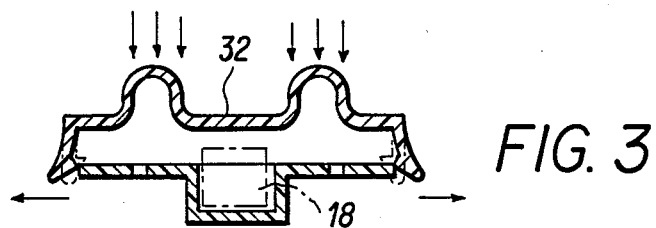
FIG. 3 is a side elevational sectional view of the carrier tape of FIG. 1 as subjected to a force; and, FIG. 4 is a side elevational view similar to FIG. 3 after the force has relaxed.

In accordance with the present invention, the cover strip 14 is further provided with a pair of humps 34,36 which are generally semi-circular in cross-section extending longitudinally along its entire length. Hump 34 is positioned to align over the line of sprocket holes 20 while hump 36 aligns over the sprocket holes 22 thereby providing clearance for the sprocket drive wheels. The humps 34,36 also provide "living hinges" for the adjacent sidewalls 24,26 that depend downwardly from the cover strip. Thus, when a downward force is exerted on the humps, the adjacent sections 38,40 of the top face of the cover strip along with their attached sidewalls 24,26 will swing upwardly and outwardly as shown in FIG. 3. The extent of outward movement of the sidewalls, in turn, is determined by the downward displacement of the humps. Accordingly, by making the hump high enough and by exerting a sufficient downward force, the profiles 28,30 may be shifted clear of the edges of the base strip thereby releasing the cover strip form the base strip, as shown in FIG. 3.

As shown in FIG. 4, the humps, when relaxed, tend to bias the sidewalls 24,26 toward each other thereby providing a positive connection between the cover strip and base strip when assembled.

Thus, in accordance with the above, the aforementioned objectives are effectively attained.

Having thus described the invention, what is claimed is:

1. A carrier tape comprising:
    an elongated base strip;
    an elongated cover strip formed of a resilient plastic material substantially coextensive in length with said base strip, said cover strip having a top surface and opposed sidewalls extending downwardly from the top surface and spaced apart from each other a distance substantially equal to the width of said base strip and cooperating to secure said cover strip to said base strip; and,
    a pair of humps defined in said top surface projecting upwardly from the top surface and extending longitudinally, parallel to said sidewalls, whereby when said humps are depressed said sidewalls move outwardly, away from each other to release said cover strip from said base strip.

2. The carrier tape in accordance with claim 1 wherein each of said sidewalls terminates in an inwardly directed barb projecting beneath said base strip, said barbs extending a distance such that when said humps are depressed said barbs move outwardly to clear said base strip.

3. The carrier tape in accordance with claim 1 wherein said base strip includes a plurality of longitudinally spaced, downwardly extending component cavities therein.

4. The carrier tape in accordance with claim 3 wherein said base strip includes two rows of longitudinally spaced sprocket holes extending therein, said rows being on opposite sides of said cavities.

5. The carrier tape in accordance with claim 4 wherein one of said humps is aligned over one of said rows of sprocket holes and the other of said humps is aligned over the other of said rows of sprocket holes.

* * * * *